(12) United States Patent
Jeong

(10) Patent No.: US 8,462,024 B2
(45) Date of Patent: Jun. 11, 2013

(54) DIGITAL SIGNAL CONVERTER AND METHOD OF CONVERTING DIGITAL SIGNAL

(75) Inventor: Chan Yong Jeong, Seoul (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 13/331,429

(22) Filed: Dec. 20, 2011

(65) Prior Publication Data

US 2013/0057416 A1 Mar. 7, 2013

(30) Foreign Application Priority Data

Sep. 2, 2011 (KR) .................. 10-2011-0088998

(51) Int. Cl.
*H03M 7/00* (2006.01)
(52) U.S. Cl.
USPC .................. 341/50; 341/55; 341/61
(58) Field of Classification Search
USPC .................. 341/50, 55, 61
See application file for complete search history.

(56) References Cited

U.S. PATENT DOCUMENTS

| | | | |
|---|---|---|---|
| 5,892,468 A | 4/1999 | Wilson et al. | |
| 6,961,790 B2 * | 11/2005 | Swope et al. | 710/104 |
| 7,286,067 B2 * | 10/2007 | Mosek et al. | 341/100 |
| 7,685,340 B1 * | 3/2010 | Gaither | 710/69 |
| 2007/0286246 A1 | 12/2007 | Kobayashi | |
| 2009/0300432 A1 | 12/2009 | Yokokura | |

FOREIGN PATENT DOCUMENTS

| | | |
|---|---|---|
| EP | 0 695 032 A1 | 1/1996 |
| KR | 10-2007-0094397 A | 9/2007 |
| KR | 2008-0100147 A | 11/2008 |
| KR | 2010-0035728 A | 4/2010 |
| KR | 10-2010-0090946 A | 8/2010 |
| WO | WO 2007/108596 A1 | 9/2007 |

OTHER PUBLICATIONS

Korean Office Action, and English translation thereof, issued in Korean Patent Application No. 10-2011-0088998 dated Aug. 23, 2012.

* cited by examiner

*Primary Examiner* — Khai M Nguyen
(74) *Attorney, Agent, or Firm* — McDermott Will & Emery LLP

(57) ABSTRACT

There are provided a digital signal converter and a method of converting a digital signal. The digital signal converter includes: a signal reception unit analyzing a digital input signal received according to a first form; a signal output unit transmitting a digital output signal according to a second form, different from the first form; and a controller converting the digital input signal received according to the first form into a digital output signal to be transmitted according to the second form, wherein the controller controls a power level of the digital output signal according to power supply methods of the first and second forms. Signal transmission and reception methods according to various interfaces may be provided in a limited form factor by adjusting the standard and coding of a digital signal transmitted and received through different interfaces and as to whether to supply power.

12 Claims, 4 Drawing Sheets

DIGITAL SIGNAL CONVERTER AND METHOD OF CONVERTING DIGITAL SIGNAL

CROSS-REFERENCE TO RELATED APPLICATIONS

This application claims the priority of Korean Patent Application No. 10-2011-0088998 filed on Sep. 2, 2011, in the Korean Intellectual Property Office, the disclosure of which is incorporated herein by reference.

BACKGROUND OF THE INVENTION

1. Field of the Invention

The present invention relates to a digital signal converter capable of converting digital signals of different schemes to allow for communications between and among various communication interfaces, and a method of converting a digital signal.

2. Description of the Related Art

As wired/wireless communication techniques supporting high rates of data transfer have become widespread, and various communications techniques, applicable to mobile terminals, have been developed, research into methods for integrating various types of communication techniques into mobile terminals having a limited form factor is ongoing. For example, some recently launched smart phones have included one or more ports, e.g., a micro USB port, allowing for the charging of a battery as well as data transmission and reception, while some products have included image and voice output terminals, e.g., a high definition media interface (HDMI) terminal, for communicating with an external video device.

However, it may be difficult for a mobile terminal having a limited form factor to support various communications schemes which have been developed or are currently being developed. In a case in which all communication modules supporting various communications schemes such as a USB, a HDMI, a DVI, a WLAN, a Bluetooth™, or similar communications scheme, are integrated in a single terminal, it may be difficult to integrate all communications modules in the limited internal area of the terminal, and further, manufacturing costs may increase.

In particular, with the development of the cloud-computing technique, which has recently come to prominence, when a user needs to exchange data with a server or a database, when a terminal does not include a particular communications scheme compatible with the server or the database, data transmissions and receptions cannot be obtained. Thus, a technique providing compatibility between or among various interface communications schemes is required.

SUMMARY OF THE INVENTION

An aspect of the present invention provides a digital signal converter capable of converting digital signals transmitted through various wired or wireless communication interfaces to be compatible with required interfaces, and a method of converting a digital signal.

According to an aspect of the present invention, there is provided a digital signal converter including: a signal reception unit analyzing a digital input signal received according to a first form; a signal output unit transmitting a digital output signal according to a second form, different from the first form; and a controller converting the digital input signal received according to the first form into the digital output signal to be transmitted according to the second form, wherein the controller controls a power level of the digital output signal according to power supply methods of the first and second forms.

The controller may include: a coding unit adjusting coding methods of the digital input signal and the digital output signal; a power processing unit controlling whether to supply digital input signal power and digital output signal power; and a signal processing unit analyzing a transmission channel standard of the digital input signal, and converting at least one of a sampling rate and an amplitude of the digital input signal according to the second form.

When power is only included in the digital input signal, the controller may transmit the power included in the digital input signal to the outside through an optional signal output terminal.

When the power is only included in the digital output signal, the controller may allow power supplied from the outside through an optional signal input terminal, to be included in the digital output signal, to thus generate the digital output signal.

When the power is included in both the digital input signal and the digital output signal, the controller may convert a power signal according to the first form into a power signal according to the second form.

The controller may include a memory storing at least one of the digital input signal and the digital output signal when data transmission and reception rates of the first and second forms are different.

According to another aspect of the present invention, there is provided a method of converting a digital signal, the method including: receiving a digital input signal according to a first form; converting at least one of a sampling rate and an amplitude of the digital input signal, and thus, generating a digital output signal according to a second form, different from the first form; and transmitting the digital output signal, wherein the generating of the digital output signal includes controlling digital output signal power according to power supply of the first and second forms.

In the generating of the digital output signal, when power is only included in the digital input signal, the power included in the digital input signal may be transmitted to the outside through an optional signal output terminal.

In the generating of the digital output signal, when the power is only included in the digital output signal, the power supplied from the outside through a optional signal input terminal may be included in the digital output signal to generate the digital output signal.

In the generating of the digital output signal, when the power is included in both the digital input signal and the digital output signal, a power signal according to the first form may be converted into a power signal according to the second form.

The method may further include storing at least one of the digital input signal and the digital output signal in a memory when a reception rate of the digital input signal and a transmission rate of the digital output signal are different.

The generating of the digital output signal may include: adjusting coding methods of the digital input signal and the digital output signal.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
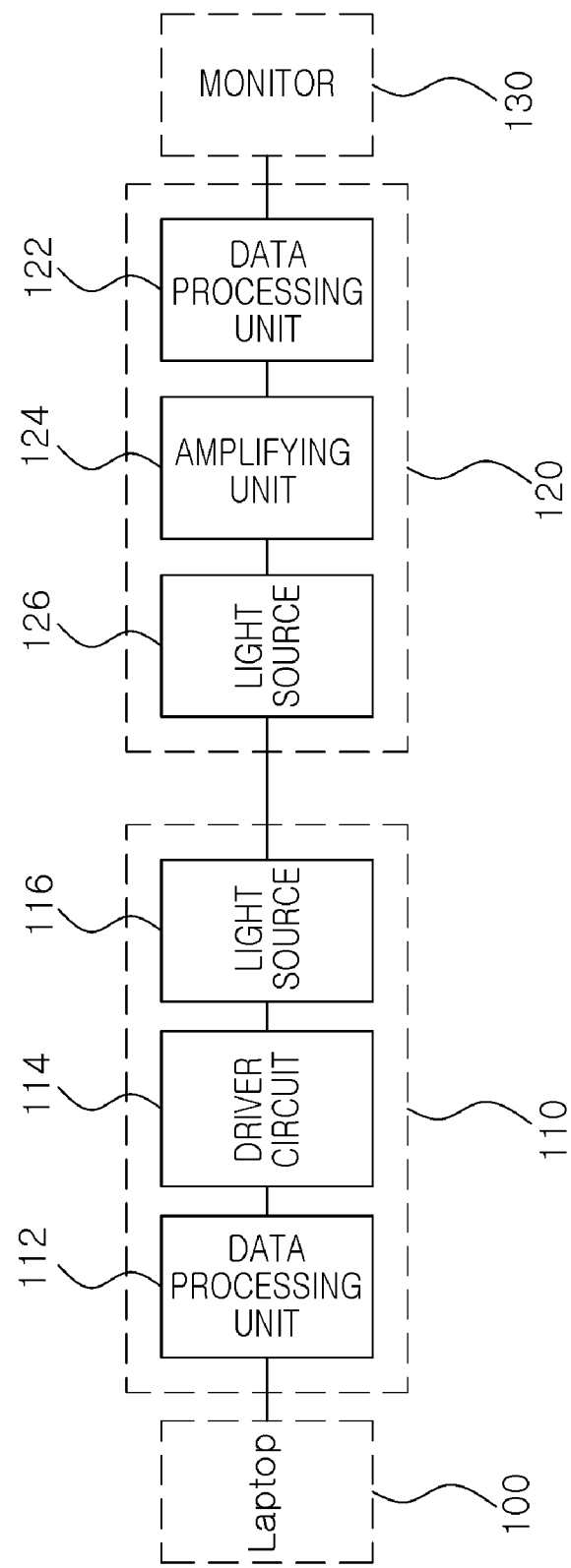
FIG. 1 is a block diagram illustrating a general digital signal transmission and reception method.

Exemplary embodiments of the present invention will be described in detail with reference to the accompanying drawings. These exemplary embodiments will be described in detail for those skilled in the art in order to be able to practice the present invention. It should be appreciated that various embodiments of the present invention are different but are not necessarily exclusive. For example, specific shapes, configurations, and characteristics described in an exemplary embodiment of the present invention may be implemented in another exemplary embodiment without departing from the spirit and the scope of the present invention. In addition, it should be understood that position and arrangement of individual components in each disclosed exemplary embodiment may be changed without departing from the spirit and the scope of the present invention. Therefore, a detailed description provided below should not be construed as being restrictive. In addition, the scope of the present invention is defined only by the accompanying claims and their equivalents if appropriate. Similar reference numerals will be used to describe the same or similar functions throughout the accompanying drawing.

Hereinafter, embodiments of the present invention will be described in detail with reference to the accompanying drawings so that those skilled in the art may easily practice the present invention.

FIG. 1 is a block diagram illustrating a general digital signal transmission and reception method. With reference to FIG. 1, in a general digital signal transmission and reception method, a transmission unit 110 generating a digital signal, and a receiving unit 120 receiving the digital signal, may be used, and also a signal transmission device 100 transmitting the digital signal, and a signal reception device 130, may be used, the signal reception device 130 being for receiving the digital signal and storing or processing data contained therein to perform an additional operation. In FIG. 1, a method of transmitting and receiving a digital signal according to a wired communications scheme will be described, but a wireless communications scheme may also be applicable thereto.

Hereinafter, for convenience of explanation, it is assumed that the signal transmission device 100 is a computer such as a laptop computer, a desktop computer, or the like, and the signal reception device 130 is a display device such as a monitor, a TV, or the like.

When the signal transmission device, namely, the computer 100, such as a laptop or desktop computer, wants to transmit a digital signal to the signal reception device, namely, the display device 130; a central processing unit (CPU) of the computer 100 may convert an image signal required to be transmitted to the display device 130 into a digital signal. The transmission unit 110 may include a data processing unit 112 for converting a digital signal to be transmitted, a driver circuit 114 transmitting the digital signal converted in the data processing unit 112 as a light signal, a light source 116 transferring the light signal, or the like. When the digital signal is transferred as an electrical signal, rather than as a light signal, different transmission equipment, rather than the light source 116, may be included in the transmission unit 110.

The light source transmitted through the light source 116 is received to the receiving unit 120 through a light source 126 thereof. The receiving unit 120 may include the light source 126 receiving the light signal, an amplifying unit 124 amplifying the received light signal, and a data processing unit 122 processing the light signal, which has been amplified in the amplifying unit 124, to convert it into a digital signal. The data processing unit 122 included in the receiving unit 120 may be a demodulation unit (or a decoder) which is different from the data processing unit 112 of the transmission unit 110 which corresponds to a modulation unit (or an encoder).

Schemes such as D-sub, DVI, HDMI, and the like, have been used for data transmission and reception between the computer 100 and the display device 130, and these schemes are all wired communications schemes. Thus, there may be difficulties in connecting a mobile terminal or a device not supporting the foregoing types of communication interfaces to a general monitor, and thus, in order to resolve the defect, an interface in the form of mini-HDMI, or the like, may be provided in some mobile devices, but in this case, only limited communications schemes may be supported in order to include a separate interface in a mobile device which is greatly limited in form factor. Thus, the present invention may provide a digital signal converter applicable to various communication interfaces and a method of converting a digital signal.

Figure 2:
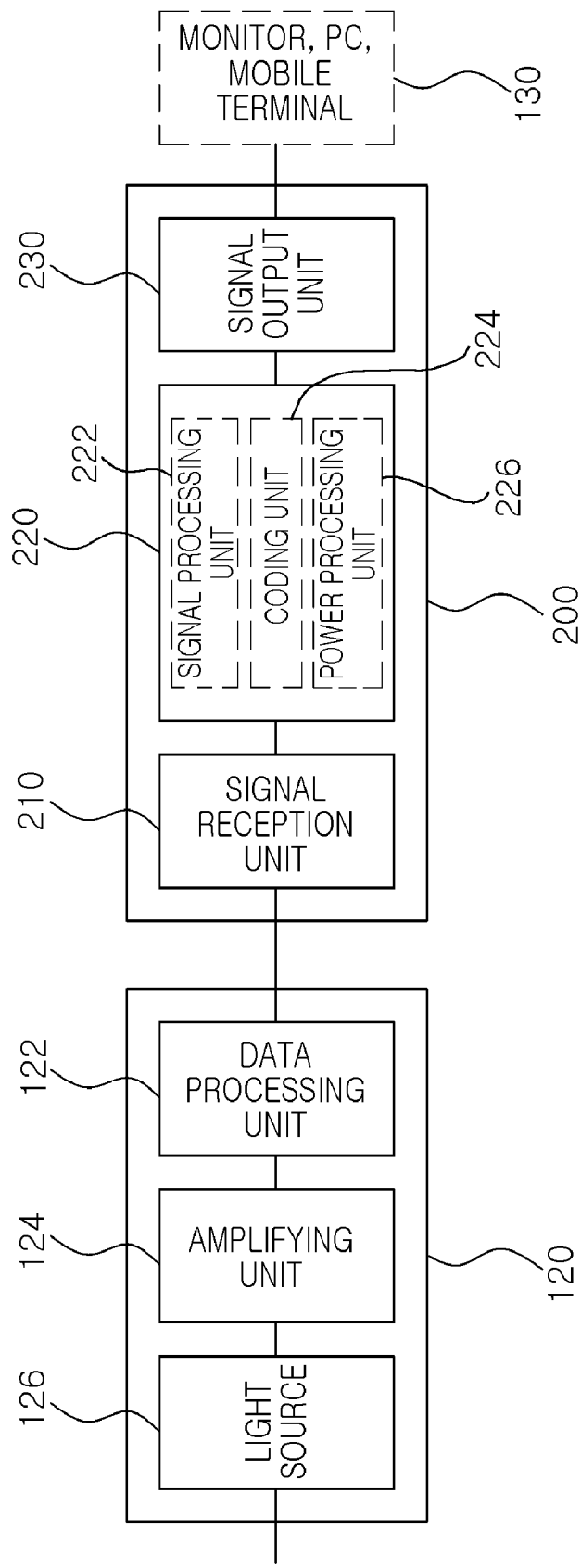
FIG. 2 is a schematic block diagram of a digital signal converter according to an embodiment of the present invention.

FIG. 2 is a schematic block diagram of a digital signal converter according to an embodiment of the present invention. With reference to FIG. 2, the digital signal converter 200 according to an embodiment of the present invention may be disposed between the receiving unit 120 receiving the digital signal and the signal reception device 130.

The digital signal converter 200, according to the embodiment of the present invention, may include a signal reception unit 210, a controller 220, and a signal output unit 230. The signal reception unit 210 may receive the signal, modulated in the data processing unit 122 of the receiving unit 120, according to a first form, and the controller 220 may convert the digital signal, received according to the first form by the signal reception unit 210, into a digital signal according to a second form, different from the first form. The digital signal, converted to have the second form, may be output through the signal output unit 230.

Hereinafter, for convenience of explanation, it is assumed that the first form according to which the signal reception unit 210 receives the digital signal is HDMI and the second form according to which the signal output unit 230 outputs the digital signal is USB. However, the application interface of the digital signal converter 200 according to the present embodiment is not limited to the USB and the HDMI, but the digital signal converter 200 may be applicable to various other interfaces, namely, various other communications schemes such as DVI, PCIe, SDIO, and the like.

When the digital input signal is received through the HDMI interface, the controller 220 may analyze the received digital signal to calculate the standard of a transmission channel, a sampling rate, a signal level (amplitude), or the like, and determines a coding scheme therefor, and whether to supply power thereto, or the like. Here, in the transmission channel standard, the controller 220 may analyze the standard of a physical layer. For example, when the signal has been received through the HDMI interface, the transmission channel (physical standard) is transition minimized differential signaling (TMDS), and high-bandwidth digital content protection (HDCP) is applied in the signal coding. The controller 220 may convert the digital input signal into a digital output signal of the USB interface based on the analysis content.

The controller 220 may include a signal processing unit 222 calculating the standard of the transmission channel, the sampling rate, the signal level, or the like, a coding unit 224 determining a coding scheme, and a power processing unit 226 determining whether to supply power, namely, determining whether to separately supply power to the digital output signal according to the second form or whether to transmit digital input signal power which has been received according to the first form to the outside, or the like. Here, the power processing unit 226 may include a separate power input/output line in order to control power between the digital input signal and the digital output signal.

When a digital input signal received through the HDMI interface is converted into a digital output signal according to the USB interface, a power signal, which is not provided by the digital input signal, should be generated and included in the digital output signal. Thus, the power processing unit 226 may receive optional power from a optional signal input terminal such as a power line, or the like, connected to the digital signal converter 200, generate a power signal corresponding to the power level of the USB interface, and include the generated power signal in the digital output signal.

Conversely, when a digital input signal received through the USB interface is converted into a digital output signal through the HDMI interface, unlike the digital input signal including a power signal, there is no need to include a power signal in the digital output signal. Thus, in this case, the power processing unit 226 may transmit the power signal included in the digital input signal to the outside of the digital signal converter 200 through a optional signal output terminal connected to the power processing unit 226.

Meanwhile, when the power supply of the digital input signal and that of the digital output signal are the same, namely, when neither the digital input signal nor the digital output signal supply a power signal, or vice versa, it is not required for the power processing unit 226 to generate or output a power signal through a optional signal input terminal or output terminal. Here, when both the digital input signal and the digital output signal supply a power signal and the levels of the two power signals are different, a voltage control circuit, e.g., a level shifter, included in the power processing unit 226 may control the difference in level between the power signals to generate a digital output signal.

The signal processing unit 222 may control a transmission channel, a sampling rate, and a signal level between the digital input signal and the digital output signal. For example, in order to control the difference in signal levels between the digital input signal and the digital output signal, the signal processing unit 222 may include an amplifying circuit, and in order to prevent a loss of data according to the difference in sampling rate, the signal processing unit 222 may include a memory.

When the sampling rate of the digital input signal is greater than that of the digital output signal, since the rate at which the digital input signal is received is faster than the rate at which the digital output signal is generated and output, space for storing the digital input signals accumulated in the digital signal converter 200, so as not to be lost, is required. The signal processing unit 222 may store the digital input signal having a relatively faster sampling rate in the separately provided memory to prevent a loss of data. Conversely, when the sampling rate of the digital output signal is greater than the sampling rate of the digital input signal, the slow reception speed of the digital input signal may affect the transmission of the digital output signal. Thus, in this case, the converted digital output signals are stored in the memory for an optional period of time, and the data stored in the memory is output in order, thus preventing a disconnection or a loss of the output signals.

Figure 3:
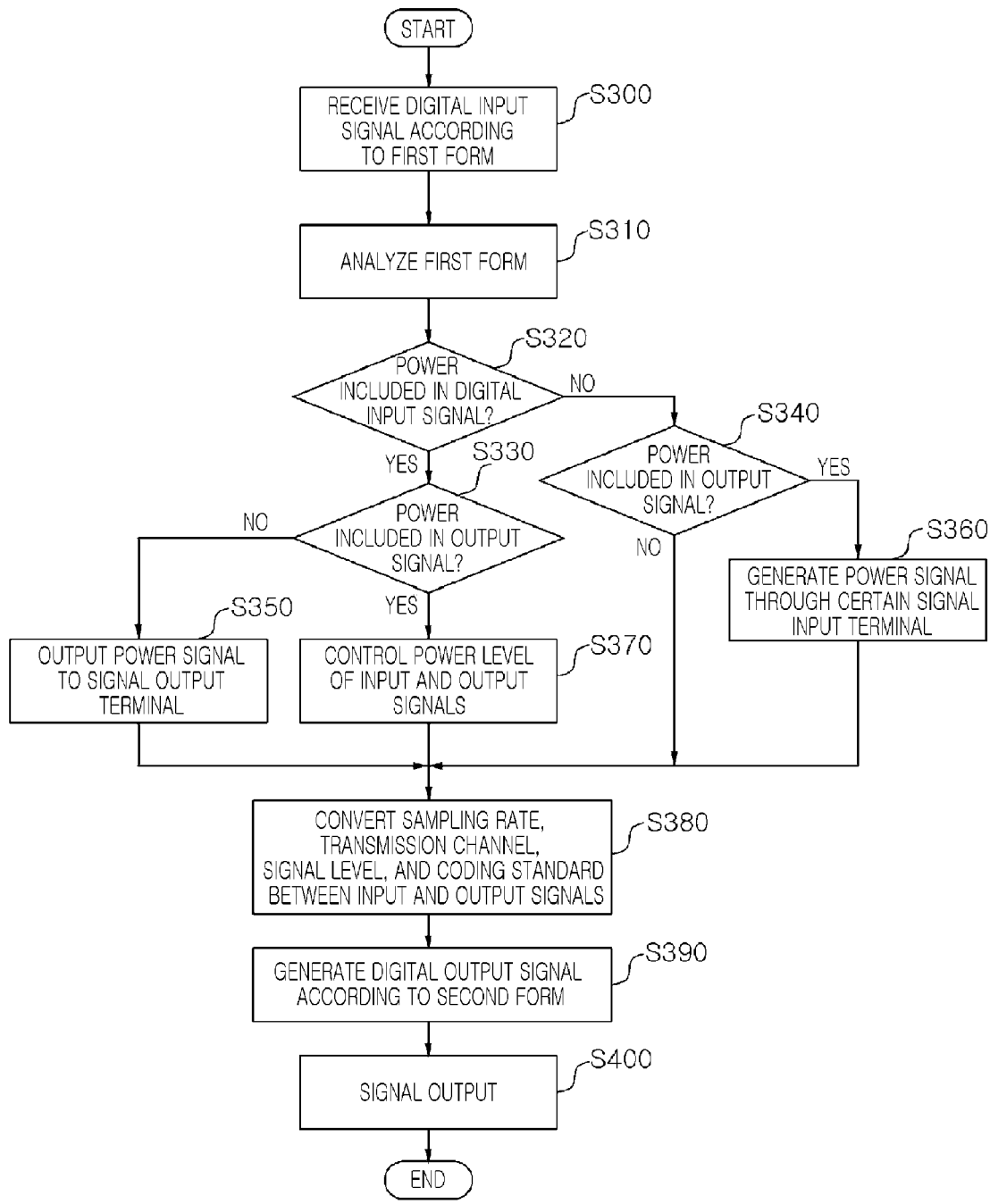
FIG. 3 is a flow chart illustrating a method of digital signal conversion method according to an embodiment of the present invention.

FIG. 3 is a flowchart illustrating a process of a method of converting a digital signal according to an embodiment of the present invention. With reference to FIG. 3, the method of converting a digital signal according to an embodiment of the present invention starts by receiving a digital input signal according to a first form (S300).

As described above, the first form may be a wireless communication interface such as Bluetooth™, Wi-Fi, UWB, or the like, as well as a wired communication interface such as HDMI, USB, SDIO PCIe, or the like. Namely, any signal transmitted through the communication interface in which data is transmitted in a digital format may be a digital input signal, the target of conversion in the present embodiment.

When the signal reception unit 210 receives the digital input signal, the controller 220 may analyze the first form according to which the digital input signal has been received, to determine a transmission channel of the communication interface through which the digital input signal has been transmitted, a sampling rate, a signal level, a coding scheme, whether to supply power, or the like (S310). The controller 220 may include the signal processing unit 222, the coding unit 224, and the power processing unit 226 for analyzing the first form. By analyzing the first form, the controller 220 may determine whether or not a power signal has been included in the digital input signal (S320), and determine whether a power signal should be included in a digital output signal which is converted according to a second form so as to be output (S330).

When the power signal is included in both the digital input and output signals, according to the determination results in operations S320 and 5330, the controller 220 may control the levels of the power signals included in the digital input and output signals (S330). When the level of the power signal included in the digital input signal is lower than that of the power signal to be included in the digital output signal, the controller 220 may amplify the power signal, and in a reverse case, the controller 220 may generate a power signal appropriate for the digital output signal by lowering the level of the power signal. When a power signal is not included in both the digital input and output signals, the controller 220 may not perform processing regarding a power signal.

When it is determined that a power signal is only included in the digital input signal in the determination results of operations S320 and 5330, the controller 220 may transmit a power signal through a optional signal output terminal connected to the digital signal converter 200 (S350). Of course, this is one method of processing the power signal only included in the digital input signal, and a method of providing the power signal of the digital input signal as a power signal of a different communication interface, or the like, may also be used.

Meanwhile, when it is determined that a power signal should only be included in the digital output signal in operations S320 and 5330, the controller 220 should generate a power signal which has not been transferred from the digital input signal, so may generate a power signal through a optional signal input terminal (S360). The optional signal input terminal may be a signal input terminal to which a power signal having an optional Vdd is input from a power unit of a computer, such as a laptop computer or a desktop computer when the digital signal converter 200 is mounted in the computer. The controller 220 may match the level, frequency, or the like, of the power signal generated through the signal input terminal to the second form of the digital output signal required to be converted.

When the process of the power signal of the digital input and output signals is completed, the controller 220 converts the sampling rate of the first form, the transmission channel, the signal level, the coding standard, or the like, according to the second form (S370). In FIG. 3 and in the present embodiment, it is described that the controller 220 completes controlling of a power signal according to whether or not power is supplied between the first and second forms, and then, controls the sampling rate, the transmission channel, the signal level, the coding standard, and the like, but the signal conversion process may be simultaneously performed in the respective blocks within the controller 220 or may be performed in different order from that illustrated in FIG. 3.

Similar to operations S320 to S360 in the embodiment of the method of controlling power as described above, the controller 220 may apply a similar processing method to the sampling rate, the signal level, or the like. For example, the controller 220 may analyze the sampling rates according to the first and second forms and when the sampling rate according to any one of the first and second forms is determined to be faster, the controller 220 may store at least one of data input and output signals in the memory which can store data, and convert the signal, thus preventing a loss of the data and a disconnection of a data transmission. Also, the controller 220 may analyze signal levels according to the first and second forms, and when a signal level according to a particular form is determined to be higher, the controller 220 may control a gain of the amplifying circuit to increase or lower the signal level, thus controlling the difference in signal levels between the digital input signal and the digital output signal.

The controller 220 may generate a data output signal transmitted according to the second form, different from the first form, by converting the standard with respect to various interfaces of the first form according to which the data input signal has been received in operations S320 to 5370 (S380). The generated data output signal may be transferred to a reception side device through the signal output unit 230, so as to be used for processing data.

Figure 4:
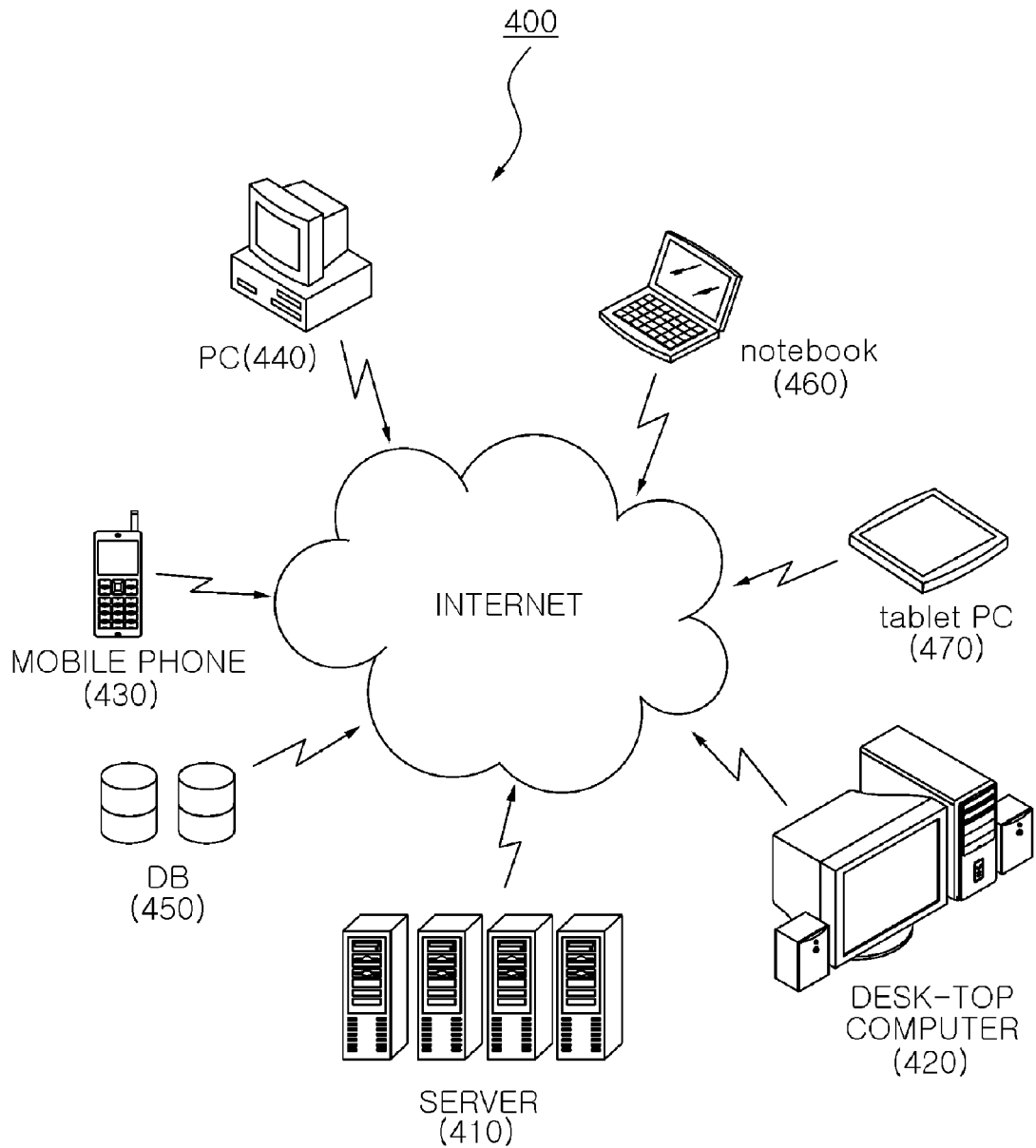
FIG. 4 is a view showing a system applicable to a digital signal converter or a digital signal conversion method according to an embodiment of the present invention.

FIG. 4 is a view showing a system applicable to a digital signal converter or a digital signal conversion method according to an embodiment of the present invention. In FIG. 4, a system 400 based on a cloud computing technique is illustrated, but the digital signal converter 200 or the digital signal conversion method according to embodiments of the present invention are not necessarily only applied to the cloud technique-based system 400.

In the cloud system 400, data, including various contents, is stored online, for example, of a server, and data is temporarily stored in a client IT device such as a desktop computer, a tablet computer, a laptop computer, a smart phone, or the like. Thus, in order to freely share data in the cloud system 400, a conversion method between various wired/wireless communication interfaces and a device providing the method are be necessarily required.

For example, in the cloud system 400, illustrated in FIG. 4, the desk-top computer 420 is connected to the Internet through a wired LAN or a wireless LAN in order to access data stored in a server 410, and a smart phone 430 to which a wired LAN is not provided may only access data by an interface such as wireless LAN or Bluetooth™ in most cases. Thus, in the case of sharing data through the Internet, when conditions under which the respective devices 420 to 470 are connected to the Internet are met, it doesn't matter to perform data sharing, but when the respective devices 420 to 470 included in the cloud system 400 are intended to directly share data or access data, discrepancy between communication interfaces provided by the respective devices 420 to 470 may be caused.

Thus, such a matter can be solved by applying the digital signal converter 200 or the digital conversion method according to embodiments of the present invention to a particular IT device. For example, the digital signal converter 200 or the digital signal conversion method according to an embodiment of the present invention may be applied for communications between the desk-top computer 420 to which only a wired LAN corresponding to relatively high speed data communication is provided and the smart phone 430 to which only radio data communication such as wireless LAN or Bluetooth™ is provided, whereby the desk-top computer 420 and the smart phone 430 can directly exchange data, which is transmitted or received through different interfaces, without passing through the Internet.

As set forth above, in the digital signal converter according to embodiments of the invention, since a digital signal received according to a first form is converted into a digital signal according to a second form and then transmitted, and the digital output signal according to the second form is controlled according to the difference in a power supply scheme, a coding scheme, or the like, between the first and second forms, so as to be universally applied to various digital signal transmission and reception interfaces.

While the present invention has been shown and described in connection with the embodiments, it will be apparent to those skilled in the art that modifications and variations can be made without departing from the spirit and scope of the invention as defined by the appended claims.

What is claimed is:

1. A digital signal converter comprising:
   a signal reception unit analyzing a digital input signal received according to a first form;
   a signal output unit transmitting a digital output signal according to a second form, different from the first form; and
   a controller converting the digital input signal received according to the first form into the digital output signal to be transmitted according to the second form,
   the controller controlling a power level of the digital output signal according to power supply methods of the first and second forms.

2. The digital signal converter of claim 1, wherein the controller includes:
   a coding unit adjusting coding methods of the digital input signal and the digital output signal;
   a power processing unit controlling whether to supply digital input signal power and digital output signal power; and
   a signal processing unit analyzing a transmission channel standard of the digital input signal, and converting at least one of a sampling rate and an amplitude of the digital input signal according to the second form.

3. The digital signal converter of claim 1, wherein when power is only included in the digital input signal, the controller transmits the power included in the digital input signal to the outside through an optional signal output terminal.

4. The digital signal converter of claim 1, wherein when the power is only included in the digital output signal, the controller allows power supplied from the outside through a optional signal input terminal, to be included in the digital output signal, to thus generate the digital output signal.

5. The digital signal converter of claim 1, wherein when the power is included in both the digital input signal and the digital output signal, the controller converts a power signal according to the first form into a power signal according to the second form.

6. The digital signal converter of claim 1, wherein the controller includes a memory storing at least one of the digital input signal and the digital output signal when data transmission and reception rates of the first and second forms are different.

7. A method of converting a digital signal, the method comprising:
receiving a digital input signal according to a first form;
converting at least one of a sampling rate and an amplitude of the digital input signal, and thus, generating a digital output signal according to a second form, different from the first form; and
transmitting the digital output signal,
the generating of the digital output signal including controlling digital output signal power according to power supply of the first and second forms.

8. The method of claim 7, wherein, in the generating of the digital output signal, when power is only included in the digital input signal, the power included in the digital input signal is transmitted to the outside through an optional signal output terminal.

9. The method of claim 7, wherein, in the generating of the digital output signal, when the power is only included in the digital output signal, the power supplied from the outside through a optional signal input terminal is included in the digital output signal to generate the digital output signal.

10. The method of claim 7, wherein, in the generating of the digital output signal, when the power is included in both the digital input signal and the digital output signal, a power signal according to the first form is converted into a power signal according to the second form.

11. The method of claim 7, further comprising storing at least one of the digital input signal and the digital output signal in a memory when a reception rate of the digital input signal and a transmission rate of the digital output signal are different.

12. The method of claim 7, wherein the generating of the digital output signal includes adjusting coding methods of the digital input signal and the digital output signal.

* * * * *